United States Patent [19]

Kowshik et al.

[11] Patent Number: 5,687,116
[45] Date of Patent: Nov. 11, 1997

[54] PROGRAMMING PULSE RAMP CONTROL CIRCUIT

[75] Inventors: Vikram Kowshik, San Jose; Andy Teng-Feng Yu, Palo Alto, both of Calif.

[73] Assignee: Programmable Microelectronics Corp., San Jose, Calif.

[21] Appl. No.: 727,875

[22] Filed: Oct. 9, 1996

[51] Int. Cl.[6] ............................................. G11C 11/34
[52] U.S. Cl. .................. 365/185.03; 365/185.19; 365/185.21; 365/185.33
[58] Field of Search ............... 365/185.03, 185.19, 365/185.21, 185.33

[56] References Cited

U.S. PATENT DOCUMENTS

| | | | |
|---|---|---|---|
| 5,163,021 | 11/1992 | Mehrotra et al. | 365/185.03 |
| 5,198,997 | 3/1993 | Arakawa | 365/185.21 |
| 5,402,370 | 3/1995 | Fazio | 365/185.21 |
| 5,541,878 | 7/1996 | LeMoncheck et al. | 365/185.21 |
| 5,572,465 | 11/1996 | Bashir | 365/185.21 |

*Primary Examiner*—David C. Nelms
*Assistant Examiner*—Trong Quang Phan
*Attorney, Agent, or Firm*—Skjerven, Morrill, MacPherson, Franklin & Friel

[57] ABSTRACT

A pulse ramp control circuit allows for the program voltage applied to the control gate of a memory cell to be ramped from a low voltage to a high voltage in a precise manner. The ramp rate of this program voltage is primarily determined by a single capacitor and the bias current provided thereto. By providing a ramped program voltage to the memory array during programming operations, present embodiments effectively cover the entire distribution of program voltage v. program current for the memory cells to be programmed, thereby minimizing over-program and under-program conditions without reducing program time.

11 Claims, 5 Drawing Sheets

PROGRAMMING PULSE RAMP CONTROL CIRCUIT

CROSS-REFERENCE TO RELATED APPLICATIONS

This application is related to commonly owned U.S. patent application Ser. No. 08/557,589 entitled "A PMOS MEMORY CELL WITH HOT ELECTRON INJECTION PROGRAMMING AND TUNNELING ERASING", filed Nov. 14, 1995; to commonly owned U.S. patent application Ser. No. 08/722,429, entitled "SWITCHING CIRCUIT FOR CONTROLLED TRANSITION BETWEEN HIGH PROGRAM AND ERASE VOLTAGES AND A POWER SUPPLY VOLTAGE FOR MEMORY CELLS, filed Oct. 3, 1996; and to commonly owned U.S. patent application Ser. No. 08/738,434, entitled "ROW DECODER CIRCUIT FOR PMOS NON-VOLATILE MEMORY CELL WHICH USES ELECTRON TUNNELING FOR PROGRAMMING", filed Oct. 24, 1996.

BACKGROUND

1. Field of the Invention

This application relates generally to providing a programming voltage to the control gates of selected non-volatile memory cells contained within an associated memory array.

2. Description of Related Art

Conventional non-volatile memories such as flash and EEPROM memories typically employ an N-channel stacked gate transistor as the memory cell. EEPROM cells may be programmed by applying a positive bias on the control gate while holding the source and drain regions at lower potentials to facilitate the tunneling of electrons into the cell's floating gate, while flash cells are typically programmed by applying a low positive bias on the drain and a larger positive bias on the control gate with the source grounded to cause the injection of hot electrons from the channel region to the floating gate. A positive high-voltage step pulse is typically applied to the control gates of such EEPROM and flash memory cells to draw electrons into the floating gates of the cells and thus program the cells.

A PMOS stacked gate memory cell has been proposed, as disclosed in the commonly owned co-pending U.S. patent application Ser. No. 08/557,589 referenced above and incorporated herein by reference. Referring to FIG. 1 herein which corresponds to FIG. 3 of that co-pending application, a P-channel memory cell 10 has a channel region 12 extending between P+ source 14 and P+ drain 16 regions formed in an N-well 18 of a P-type substrate 20. A floating gate 22 is insulated from the surface of N-well 18 by a thin tunneling oxide layer 24. A control gate 26 overlies floating gate 22. Cell 10 is programmed by applying approximately 5–9 volts to P+ source 14 and N-well 18 while P+ drain 16 is held at between approximately 1.5 and 2 volts. A programming voltage between approximately 5 and 12 volts is applied to control gate 26. Positively charged holes are attracted to the less positive voltage on P+ drain 16 and are accelerated through channel region 12 towards P+ drain 16. These holes collide with electrons and lattice atoms in a drain depletion region 30, thereby resulting in impact ionization. The high energy electrons generated from impact ionization, attracted by the positive voltage on control gate 26, are injected from depletion region 30 into floating gate 22. The resultant negative charge on floating gate 22 depletes channel region 12 and results in a more positive threshold voltage $V_T$ for cell 10.

The programming current I generated during programming of a memory cell such as, for instance, PMOS memory cell 10 is a function of the programming voltage $V_p$ applied to its control gate. It is important for this programming voltage ramp pulse $V_p$ to be maintained within a certain voltage range to ensure that a maximum programming current, and thus a minimum programming time, is achieved. However, due to process variations inherent in the fabrication of MOS memory arrays, the particular $V_p$ v. I characteristic of individual memory cells may vary, as shown in the distribution curve of FIG. 2. For instance, assuming that each of PMOS memory cells are identical, i.e., assuming no process variations in fabrication of cells 10, a predetermined programming voltage $V_p$ applied to the control gates 26 of PMOS memory cells 10 for approximately 2–5 μs results in a programming current I of approximately $10^{-9}$ Amps in each of cells 10 which, as determined by Applicants, results in the proper programming of all of cells 10. However, due to process variations inherent in the fabrication of PMOS cells 10, cells 10 may have slightly different threshold voltages $V_t$, as indicated in FIG. 2. Thus, the application of a step pulse of a predetermined voltage level may result in some of cells 10 being over-programmed and others of cells 10 being under-programmed. Of course, the application of this step pulse of a predetermined voltage will result in the proper programming of most of cells 10 in an associated memory array.

Accordingly, the application of a programming voltage step pulse to the control gates of associated memory cells 10 during programming operations induces different programming currents in the various memory cells 10 and, thus, results in various ones of cells 10 being programmed to varying degrees, i.e., some of cells 10 are under-programmed, some of cells 10 are over-programmed, and, of course, some of cells 10 are properly programmed. This resultant distribution of programming completeness may result not only in the erroneous programming of some cells 10 but also in damage to some cells 10.

Consequently, there presently exists a need for a circuit capable of providing and precisely controlling the programming voltage provided to the control gate(s) of memory cells in an associated memory array in a manner that results in a proper programming of all memory cells selected for programming.

SUMMARY

Applicants have found that the above-described problems may be alleviated by providing an incrementally ramped programming voltage to the control gates of memory cells during programming operations. In accordance with the present invention, a pulse ramp control circuit provides a ramped programming voltage to the control gate(s) of a memory cell(s) to ramp the control gate from a low voltage to a high voltage in a precise manner. In one embodiment, the ramp rate of the programming voltage is determined by a single capacitor. In some embodiments, the programming voltage is ramped from a first potential to a second potential to program selected memory cells. The ones of selected memory cells which were properly programmed are then de-selected. The programming voltage is ramped from the second potential to a third potential, thereby further increasing the threshold voltage $V_T$ of those memory cells still selected for programming. This process is repeated until all of the memory cells selected for programming are properly programmed. In this manner, present embodiments provide to the selected memory cells of an associated memory array a ramped programming voltage that spans the $V_p$ v. I distribution for each of the memory cells contained within the associated memory array, thereby minimizing over-program and under-program conditions while simultaneously reducing program time.

DETAILED DESCRIPTION

Figure 1:
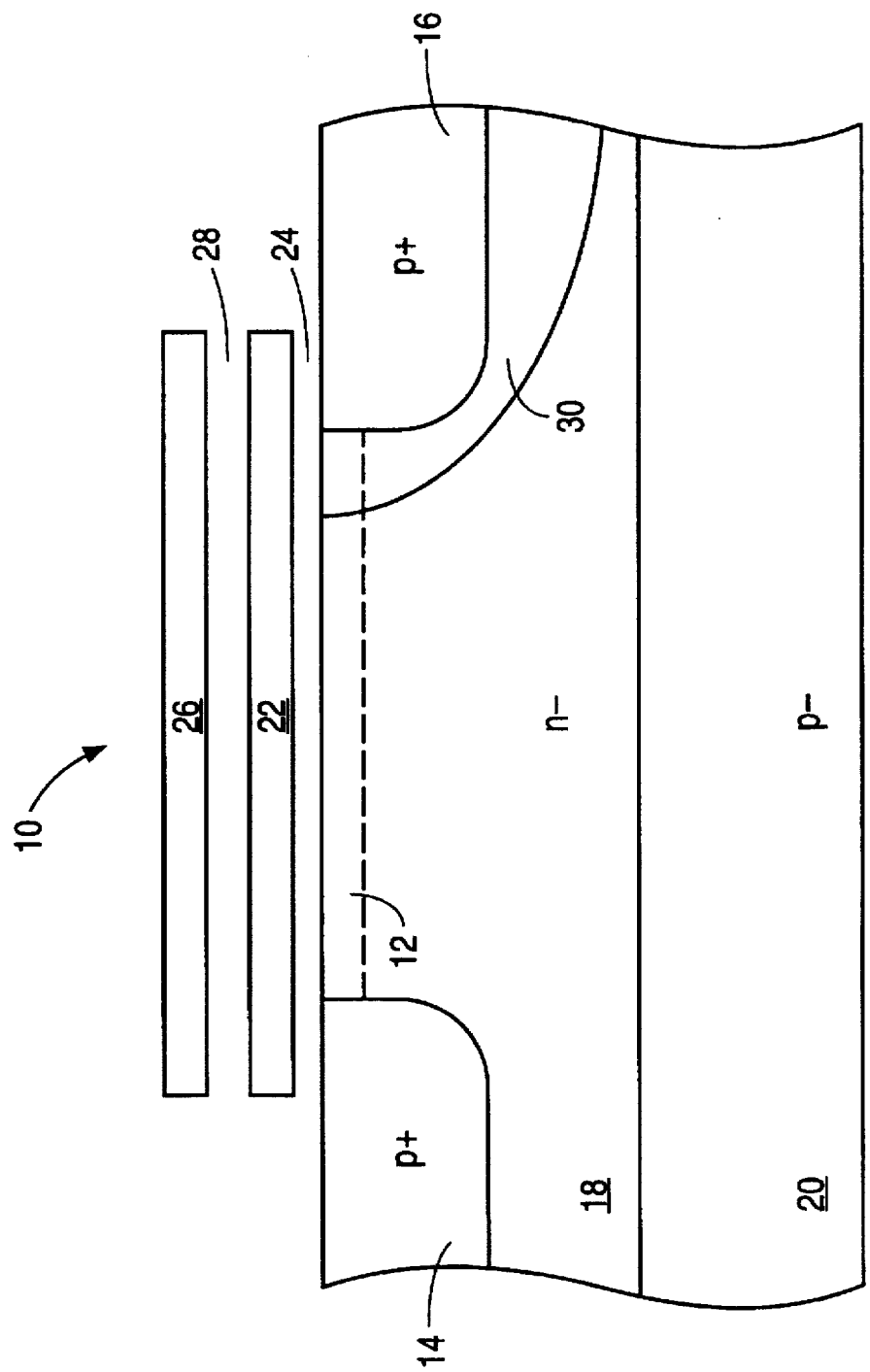
FIG. 1 is a cross-sectional view of a PMOS stacked gate memory cell in accordance with the above-referenced co-pending U.S. patent application Ser. No. 08/557,589 bearing attorney docket No. M-3546 US.

The operation of ramping circuit 50 (FIG. 3) is discussed below in the context of a memory system 100 including a conventional oscillator 102, a conventional charge pump 104, a conventional high-voltage regulator 106, and an associated memory array 108 (not shown in detail). A voltage supply $V_{DD}$ provides an operating voltage of for instance, 5 volts, to system 100, although supply $V_{DD}$ may in other embodiments be of voltage different than 5 volts. Circuit 50 provides to memory array 108 a programming voltage $V_p$ having a precisely controlled ramp rate on line $V_{pp}$. For purposes of discussion below, memory array 108 employs PMOS stacked gate memory cells such as cell 10 of FIG. 1. However, it is to be understood that embodiments in accordance with the present invention are equally applicable to memory arrays employing other types of memory cells such as, for instance, NMOS EEPROM and NMOS Flash memory cells. Further, embodiments in accordance with the present invention may be employed in any application where it is desired to provide a precisely controlled ramped programming voltage including, for instance, fuses and antifuses.

Figure 3:
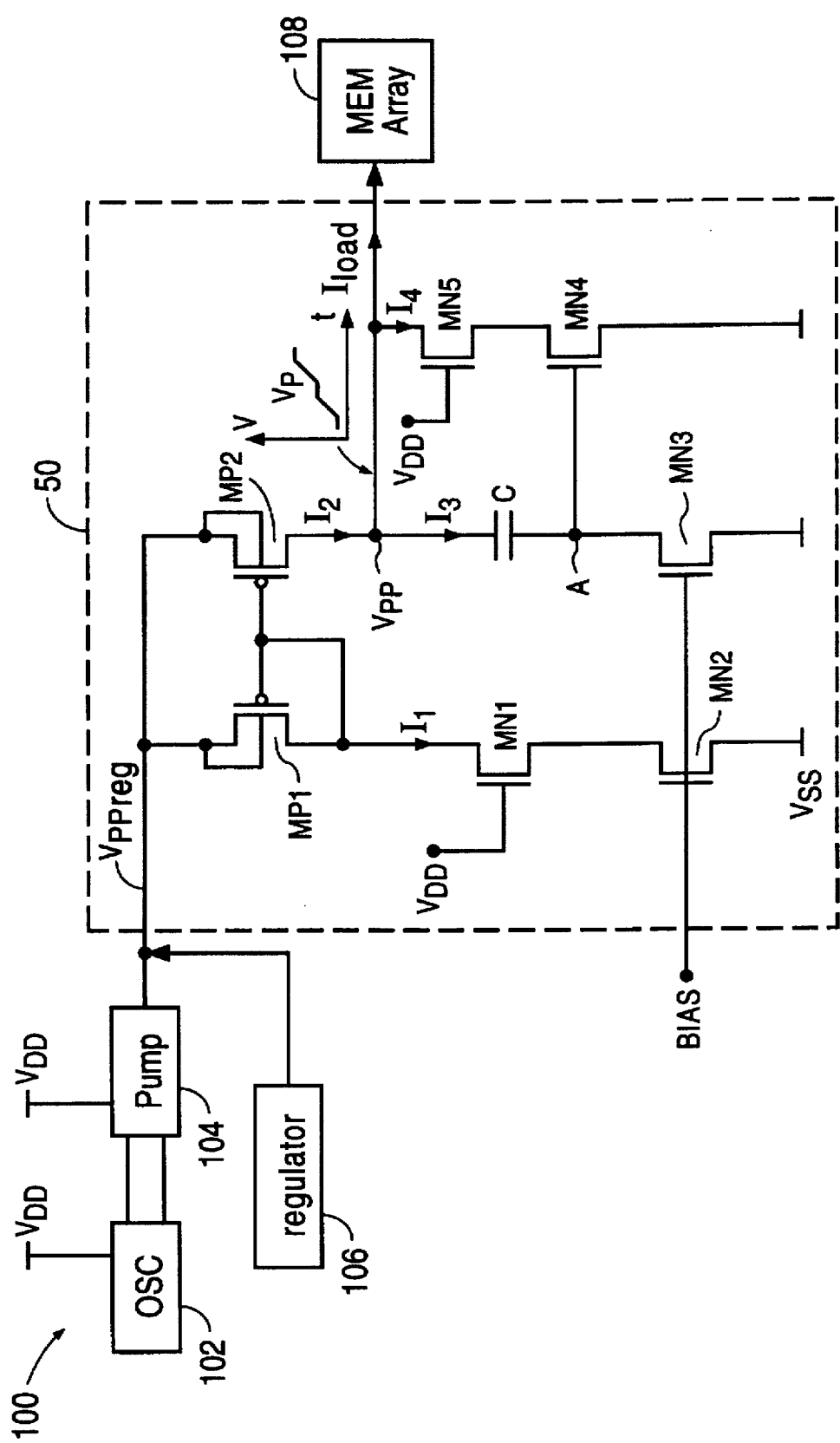
FIG. 3 is a schematic diagram of a pulse ramp control circuit in accordance with the present invention.

Circuit 50 includes a current mirror formed of PMOS transistors MP1 and MP2 which, as shown in FIG. 3, have their sources connected to line $V_{ppreg}$. A first leg of the current mirror e.g. transistor MP1 is coupled to series connected NMOS isolation transistor MN1 and NMOS bias transistor MN2, while the other leg of the current mirror e.g. transistor MP2 is coupled to a first plate of capacitor C. The second plate of capacitor C (node A) is connected to the drain of NMOS transistor MN3, the source of which is connected to ground. The gates of transistors MN2 and MN3 are connected to a bias node BIAS which, in turn, is connected to suitable bias circuitry (not shown) such as, for instance, a bandgap referenced current source. This bias circuitry induces in transistor MN2 an adjustable bias current $I_1$ which should preferably not vary with the supply voltage $V_{DD}$, temperature, or manufacturing process considerations. Transistor MN1, the gate of which is connected to voltage supply $V_{DD}$, isolates voltages present on line $V_{ppreg}$ from biasing transistor MN2.

Figure 4:
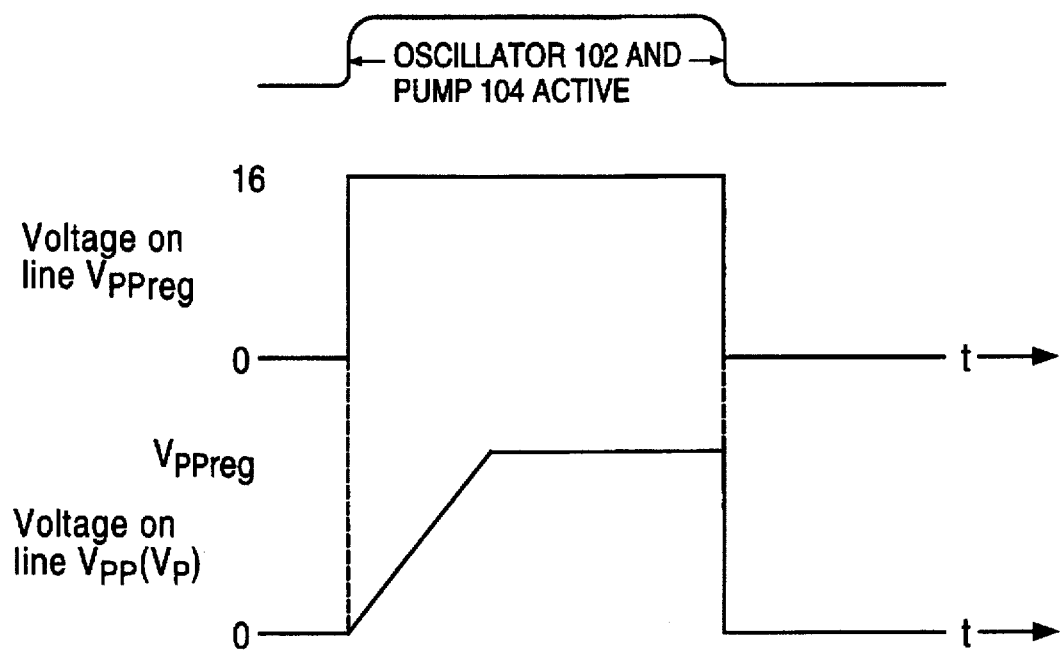
FIG. 4 is a graph illustrating the ramping of a programming voltage using the control circuit of FIG. 3.

When it is desired to apply a ramped programming voltage $V_p$ to the memory cells 10 within memory array 108 via line $V_{pp}$, oscillator 102 and charge pump 104 are activated in a well known manner to provide a high voltage (16 volts is shown for reference only) on line $V_{ppreg}$, as illustrated in FIG. 4. This high voltage on line $V_{ppreg}$ is regulated in a well known manner by high voltage regulator 106. The bias circuitry (not shown) connected to node BIAS induces a current flow $I_1$ in transistors MP1, MN1, and MN2. A current $I_2$ is reflected in transistor MP2 which is divided into a current $I_3$ flowing to capacitor C, a current $I_4$ flowing to transistor MN5, and a load current $I_{load}$ flowing to memory array 108. The magnitude of the current $I_2$, and thus the magnitude of current $I_3$ and $I_{load}$, may be adjusted with respect to current $I_1$ in a well known manner by manipulating the channel width-to-length (W/L) ratio of transistor MP2 with respect to the W/L ratio of transistor MP1. In this manner, the operation of circuit 50 may be optimized depending upon desired operating characteristics of circuit 50 as well as the load characteristics of, for instance, memory array 108.

The current $I_3$ charges capacitor C from approximately zero volts to the high voltage on line $V_{ppreg}$ and, accordingly, charges the programming voltage $V_p$ on line $V_{pp}$ from approximately zero volts to approximately the voltage on line $V_{ppreg}$, as illustrated in FIG. 4. In other embodiments, the programming voltage $V_p$ on line $V_{pp}$ may be ramped from an initial voltage different from zero volts such as, for instance, the supply voltage $V_{DD}$, up to the high voltage on line $V_{ppreg}$. The rate of increase of the programming voltage $V_p$ on line $V_{pp}$ is primarily determined by the current $I_3$ and the capacitance of capacitor C. The ramp rate of $V_p$ is constant and may be expressed as:

Thus, the ramp rate of the programming voltage $V_p$ $$\frac{dV_p}{dt} = \frac{I_3}{C}$$

on line $V_{pp}$ provided to memory array 108 may be precisely controlled by selecting an appropriately sized capacitor C and by controlling the magnitude of the current $I_3$. The magnitude of the current $I_3$ may be manipulated by adjusting the scaling factor between transistors MN2 and MN3. For instance, in one embodiment, where capacitor C is a 1.67 pF capacitor, the bias current circuitry (not shown) connected to node BIAS is operated to cause a current flow $I_3$ of 1 µA to flow into capacitor C, thereby causing the programming voltage $V_p$ on line $V_{pp}$ to increase from approximately zero volts to a regulated high voltage of, for instance, 16 volts on line $V_{ppreg}$ in approximately 20 µs. Of course, the ramping rate of the programming voltage $V_p$ on line $V_{pp}$ may vary, as determined by the size of capacitor C and the current $I_3$, and may be adjusted depending upon the particular operating parameters of memory array 108 and upon the desired programming characteristics, i.e., programming speed, of memory array 108.

NMOS transistors MN4 and MN5, which are series connected between line $V_{pp}$ and ground, maintain a constant charging rate of capacitor C as follows. Transistor MN4 has its gate connected to node A and operates to shunt current from capacitor C, while transistor MN5, the gate of which is connected to supply voltage $V_{DD}$, provides high voltage isolation between line $V_{pp}$ and shunting transistor MN4. If during programming operations capacitor C charges at a rate greater than $I_3/C$, the voltage at node A increases beyond the threshold voltage $V_t$ of transistor MN4 and thereby turns on transistor MN4. Once conducting, transistor MN4 completes a current path from line $V_{pp}$ to ground and thereby shunts a current $I_4$ to ground. By reducing the current flow $I_3$ to capacitor C, the conduction of transistor MN4 reduces the charging rate of capacitor C. As the charging rate of capacitor C falls below $I_3/C$, the voltage on node A falls and causes transistor MN4 to turn off, thereby allowing the charging rate to again increase to $I_3/C$.

Figure 5:
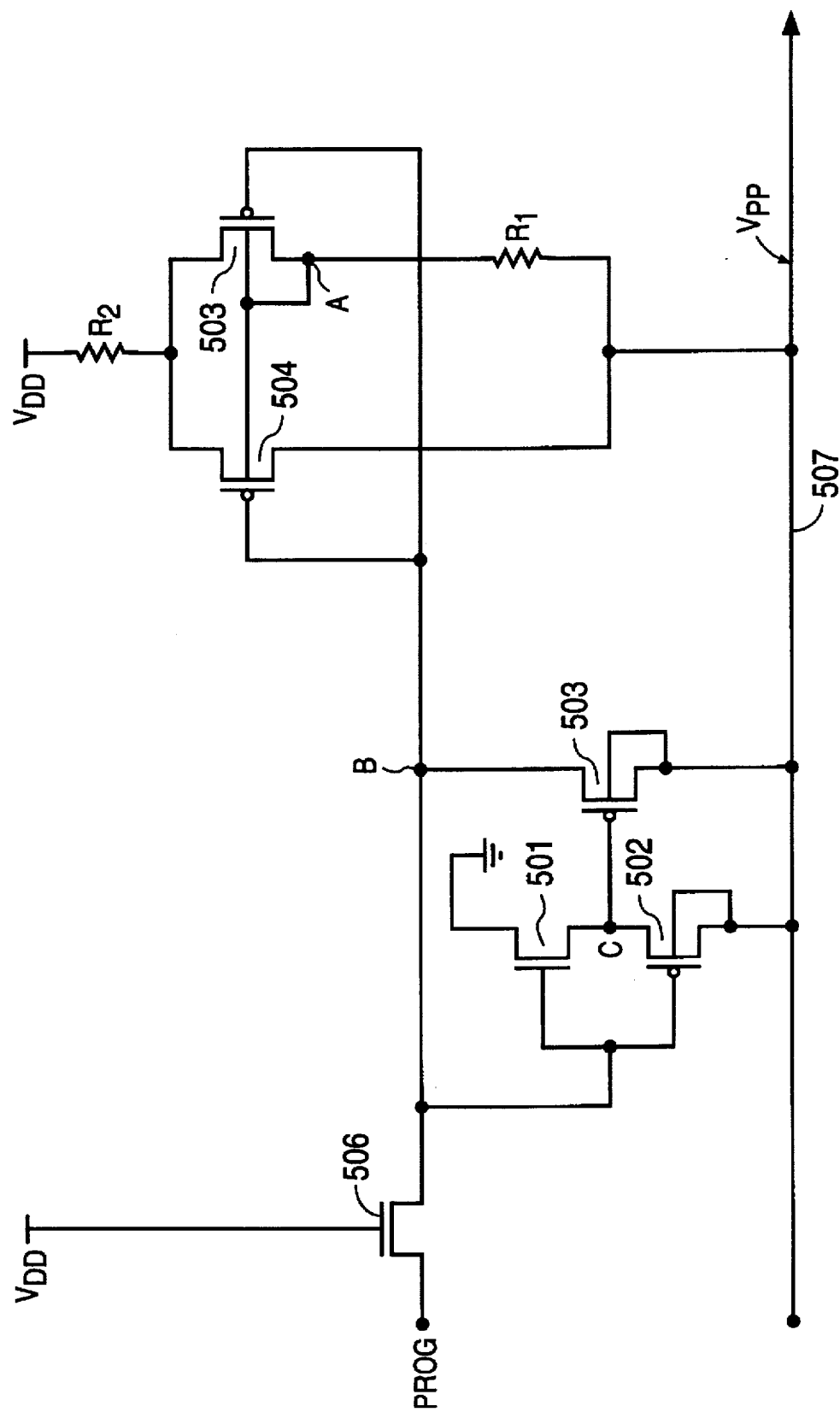
FIG. 5 is a schematic diagram of a switching circuit in accordance with the above-referenced copending U.S. patent application Ser. No. 08/722,429.

When programming is complete, oscillator 102 and charge pump 104 are de-activated. The voltage on line $V_{ppreg}$ is allowed to discharge to $V_{DD}$ using a switching circuit coupled between $V_{DD}$ and line $V_{ppreg}$ which, in some embodiments, may be a switching circuit in accordance with the above-referenced U.S. patent application Ser. No. 08/722,429, US, incorporated herein by reference, as shown in FIG. 5 herein (FIG. 5 of the present application corresponds to FIG. 4 of the above-referenced co-pending application). The voltage on line $V_{pp}$ is then allowed to discharge to ground potential using conventional means (not shown for simplicity) and by adjusting signal BIAS so as to terminate current flows $I_1$ and $I_2$ in transistors MP1 and MP2, respectively. In other embodiments, line $V_{pp}$ may be discharged to $V_{DD}$ via a switching circuit such as, for instance, that shown in FIG. 5. In FIG. 5, after programming memory array 108, programming voltage $V_p$ is high on line 507. Line 507 in FIG. 5 carries the same programming voltage as line $V_{pp}$ in FIG. 3. Programming signal PROG goes to ground potential, thereby discharging node B to ground potential via NMOS transistor 506. As the potential on node B falls to ground, NMOS transistor 501 turns off and PMOS transistor 502 turns on. The inverter formed by transistors 502 and 501 thus transitions to a logic high state at node C, which turns off PMOS transistor 503 to isolate line 507 from node B. The discharging of node B also turns on PMOS transistors 504 and 505. Line 507 discharges until the potential of line 507 equals that of supply voltage $V_{DD}$, where the conductive states of transistors 504 and 505 maintain the potential of line 507 approximately equal to that of supply voltage $V_{DD}$. Resistor $R_1$ limits the discharge rate of node A, while resistor $R_2$ and respective source-to-well capacitances of transistors 504 and 505 filter out the high frequency components of noise on supply voltage $V_{DD}$. The resultant non-conductive states of transistors MP1 and MP2 electrically isolate line $V_{pp}$ from line $V_{ppreg}$, thereby allowing the programming voltage $V_p$ on line $V_{pp}$ to be independent of the voltage on line $V_{ppreg}$.

One advantage of circuit 50 is that the ramp rate of the programming voltage $V_p$ on line $V_{pp}$, as given in the equation above, is substantially independent of the load capacitance of circuit 50 (i.e., the capacitance of memory array 108). That is, as long as transistor MP2 is capable of supplying a current $I_2$ sufficient to not only charge capacitor C, i.e., $I_3$, but also to drive memory array 108, i.e., $I_{load}$, the charging rate of capacitor C depends only on the current $I_3$ and not upon the load current $I_{load}$. Thus, the proper operation of circuit 50 requires that current $I_{load}$ is entirely supplied by transistor MP2 and does not shunt current from capacitor C. In preferred embodiments, the charging current $I_3$ is in the 1 µA range. The load current $I_{load}$ may vary from between approximately 20 µA to 200 µA or more, depending upon the number, size, configuration, and type of memory cells employed in associated memory array 108.

Figure 2:
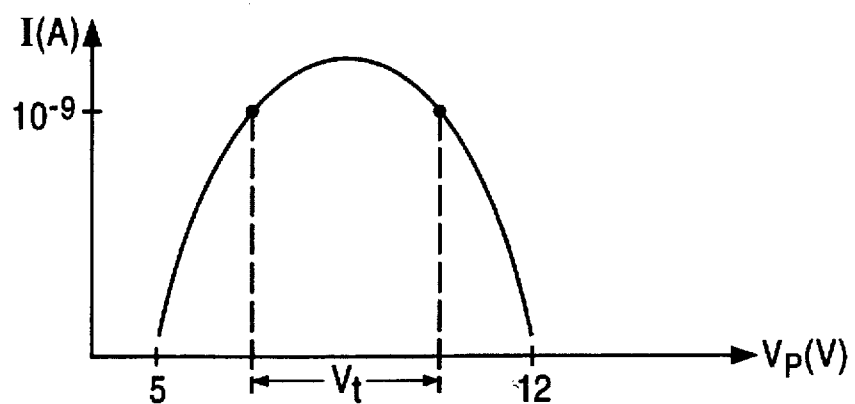
FIG. 2 is a graph exemplifying the programming voltage $V_p$ v. program current I distribution of various ones of the cells of FIG. 1 included within an associated memory array.
Figure 6:
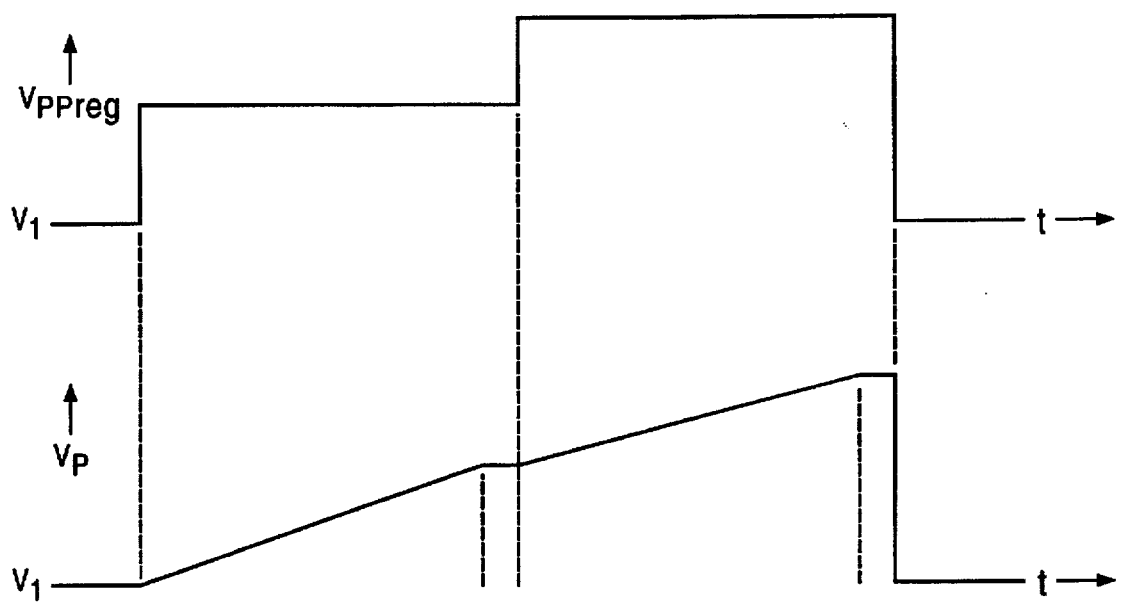
FIG. 6 is a graph illustrating the incremental ramping of a programming voltage using the control circuit of FIG. 3.

As discussed above, providing a precisely controlled ramped voltage to memory array 108 during programming operations is necessary to ensure proper programming of cells within array 108. Referring again to FIG. 2, increasing the programming voltage $V_p$, on line $V_{pp}$ from a low voltage to a high voltage level ensures that none of the memory cells 10 are under programmed. However, to ensure that those of memory cells 10 which have a lower threshold voltage are not over-programmed, the programming voltage $V_p$ on line $V_{pp}$ may be ramped in an incremental manner. For instance, in a first cycle of a programming operation, the programming voltage or potential $V_p$ on line $V_{pp}$ may be ramped from, for instance, 0 volts to, for instance, 6 volts. This voltage is briefly maintained constant by the associated bias circuitry connected to node BIAS while control circuitry (not shown) provided within memory array 108 performs a program verify to determine which of memory cells 10 that were selected for programming were indeed properly programmed. This control circuitry then selects for re-programming those of cells 10 that were previously selected for programming but were not properly programmed. The voltage on line $V_{ppreg}$ is then increased in a well known manner by charge pump 104 to a higher voltage such as, for instance, 7 volts. The programming voltage $V_p$ on line $V_{pp}$ is then ramped from 6 volts to the higher voltage on line $V_{ppreg}$, e.g., 7 volts and then maintained constant while the control circuitry (not shown) within memory array 108 again verifies that all of the selected cells 10 have been properly programmed. This process, shown generally in FIG. 6 where the initial voltage $V_1$ can be negative, is repeated until the control circuitry (not shown) has verified that all of cells 10 initially selected for programming have been properly programmed.

In this manner, circuit 10 provides a mechanism by which all of cells 10 of memory array 108 that are desired to be programmed are properly programmed. By ramping the programming voltage $V_p$ on line $V_{pp}$ from a low voltage to a high voltage, each of the selected ones of memory cells 10 will be programmed, irrespective of variations in operating characteristics e.g. threshold voltage thereof. Further, by excluding (e.g., de-selecting for programming) those cells which have already been programmed from application of even higher programming voltages $V_p$ on line $V_{pp}$ in reprogramming operations, i.e., over-programming of those of cells 10 which have lower threshold voltages is prevented.

Note that circuit 50 will operate properly in the absence of isolation transistors MN1 and MN5. However, elimination of transistor MN5 would require transistor MN4 to sustain higher breakdown voltages. In a similar manner, the elimination of transistor MN1 would require transistor MN2 to sustain higher breakdown voltages.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention.

We claim:

1. A circuit for providing a ramped programming voltage to an associated memory array using a programming voltage line, said circuit comprising:

a regulated voltage line having a first voltage thereon;

a capacitor having a first plate connected to said programming voltage line and having a second plate connected to a node;

an adjustable current source connected between said regulated voltage line and said first plate of said capacitor and coupled to receive a bias level, wherein said adjustable current source provides a charging current, the magnitude of which is influenced by said bias level, to said capacitor, thereby charging said programming voltage line to said regulated voltage line; and a control circuit coupled between said programming voltage line and ground potential and having a control terminal connected to said node, said control circuit shunting current from said capacitor when the charging rate of said capacitor increases beyond a predetermined amount.

2. The circuit of claim 1, wherein said control circuit comprises:

a first transistor having a gate connected to said node, a source connected to ground, and a drain; and means connecting said drain of said first transistor to said programming voltage line.

3. The circuit of claim 2, wherein said means comprises a second transistor having a drain connected to said programming voltage line, a gate connected to a voltage supply, and a source connected to said drain of said first transistor, said second transistor providing high voltage isolation between said programming voltage line and said first transistor.

4. The circuit of claim 1, wherein said adjustable current source further comprises:

a first transistor having a source connected to said regulated voltage line, a drain connected to said first plate of said capacitor and to said programming voltage line, and a gate;

a second transistor having a source connected to said regulated voltage line and having a gate and a drain connected to said gate of said first transistor;

a third transistor having a gate coupled to receive said bias level, a source connected to ground, and a drain; and means connecting said drain of said third transistor to said drain of said second transistor.

5. The circuit of claim 4, wherein said means comprises a fourth transistor having a drain connected to the commonly coupled gate and drain of said second transistor, a gate connected to a voltage supply, and a source connected to said drain of said third transistor, said fourth transistor providing high voltage isolation between said regulated voltage line and said third transistor.

6. The circuit of claim 5, further comprising a fifth transistor having a drain connected to said second plate of said capacitor, a gate coupled to receive said bias level, and a source connected to ground.

7. A method of programming a plurality of non-volatile memory cells, said method comprising:

(a) providing to said memory cells a first program voltage which ramps from a first voltage to a second voltage to program said memory cells, said second voltage being greater than said first voltage;

(b) identifying those ones of said memory cells which were not properly programmed; and (c) providing to those ones of said memory cells identified in step (b) a second program voltage which ramps from said second voltage to a third voltage, said third voltage being greater than said second voltage.

8. The method of claim 7, wherein said first voltage comprises ground potential.

9. The method of claim 7, wherein said first voltage comprises a supply voltage.

10. The method of claim 7, wherein said second and third voltages comprise positive potentials.

11. The method of claim 7, wherein said first voltage comprises a negative voltage and said second and third voltages comprise potentials more positive than said first voltage.

* * * * *